(12) United States Patent
Wu

(10) Patent No.: US 6,866,975 B2
(45) Date of Patent: Mar. 15, 2005

(54) BEST FOCUS DETERMINING METHOD

(75) Inventor: Yuan-Hsun Wu, Jungli (TW)

(73) Assignee: Nanya Technology Corporation, Taoyuan (TW)

( * ) Notice: Subject to any disclaimer, the term of this patent is extended or adjusted under 35 U.S.C. 154(b) by 167 days.

(21) Appl. No.: 10/313,733

(22) Filed: Dec. 5, 2002

(65) Prior Publication Data

US 2004/0013955 A1 Jan. 22, 2004

(30) Foreign Application Priority Data

Jul. 17, 2002 (TW) ........................................ 91115908 A

(51) Int. Cl.⁷ .............................. G03F 9/00; G03C 5/00
(52) U.S. Cl. ........................................................ 430/30
(58) Field of Search .................................. 430/30, 311

(56) References Cited

U.S. PATENT DOCUMENTS

| | | | |
|---|---|---|---|
| 5,807,647 A | * | 9/1998 | Hashimoto .................... 430/5 |
| 6,376,139 B1 | * | 4/2002 | Fujisawa et al. ............... 430/30 |
| 6,667,139 B2 | * | 12/2003 | Fujisawa et al. ............... 430/30 |
| 2003/0031943 A1 | * | 2/2003 | Nakao et al. .................. 430/30 |

* cited by examiner

*Primary Examiner*—Christopher G. Young
(74) *Attorney, Agent, or Firm*—Merchant & Gould P.C.

(57) ABSTRACT

A best focus determining method. First, a test mask is provided, wherein the test mask comprises a transparent substrate and an opaque layer covering parts of the transparent substrate to define a first transparent area with 0° phase and a second transparent area with 90° phase. The sizes of the two transparent areas are the same. Next, a light source is provided and transmits the test mask to perform an exposure. Then, a first image corresponding to the first transparent area and a second image corresponding to the second transparent area are formed. The sizes of the first and second images are measured to ensure the best focus possible.

8 Claims, 5 Drawing Sheets

(a)

(a)

BEST FOCUS DETERMINING METHOD

BACKGROUND OF THE INVENTION

1. Field of the Invention

The present invention relates in general to photolithography, and particularly to focus method during exposure.

2. Description of the Related Art

Photolithography, comprising priming, photoresist coating, baking, exposure, post bake, and development, is used to transfer specific patterns on semiconductor devices or integrated circuits during the fabrication process. A masking step transfers the pattern of a photomask on a photoresist layer on the device surface by exposing the photoresist through the mask. Selected areas of the photoresist, based on the pattern of the mask, are then etched so that subsequent process steps, such as impurity introduction, oxidation, and metallization, can be performed. A semiconductor device with the desired electrical properties is then obtained after several of the photolithography and etching steps. The critical factor of the yield of the semiconductor devices depends on the photolithography.

Because of further increases in density of circuit pattern of LSI and further reduction in line width of patterns to be transferred, into a submicron order, in exposure apparatuses to be used in a lithographic process for LSI manufacture it is very important to accurately set the best focus position, namely, best exposure conditions, to keep the resolving power of a projection lens constant.

Conventional focus method is performed using a test mask having a rhomboid transparent area and an exposure apparatus to determine the best focus position by the user until the exposed image is almost rhomboid.

However, it is not accurate for users to determine the best focus position. Additionally, it is time consuming to change from the test mask to the process mask after focusing.

SUMMARY OF THE INVENTION

Accordingly, an object of the invention is to provide a best focus determining method to avoid the inaccuracy of conventional user-determined focus.

Another object of the invention is to provide a best focus determining method that can be performed any time during any exposure without extra apparatus or process.

The method comprises the following steps. First, a test mask comprising a transparent substrate and an opaque layer covering parts of the transparent substrate to define a first transparent area with 0° phase and a second transparent area with 90° phase is provided, wherein the sizes of the two transparent areas with 0° and 90° phases respectively, are the same. Next, a light source is transmitted through the test mask to expose a first image corresponding to the first transparent area with 0° phase and a second image corresponding to the second transparent area with 90° phase, wherein the light source maintains a distance from the test mask. The sizes of the first and second images are then measured. Finally, after adjusting the distance between the light source and the test mask, the exposure step and the size measurement step both mentioned above are repeated until the sizes of the first and second images are the same if the originating sizes of the first and second images thereof were different. Thus, the best focus position is achieved.

According to the present invention, the first image exposed by the first transparent area with 0° phase and the second image exposed by the second transparent area with 90° phase both absorb equivalent energy when the light source is located at the best focus position, such that the sizes of the first and second images are the same. Therefore, the best focus position is determined by determining if the sizes of the first and second images are the same.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

There will now be described an embodiment of this invention with reference to the accompanying drawings.

First, in step S800, a test mask 100, such as an alternate phase shift mask, an attenuated phase shift mask, or a rim phase shift mask, is set in an exposure apparatus to serve as a focus assist tool.

Figure 1:
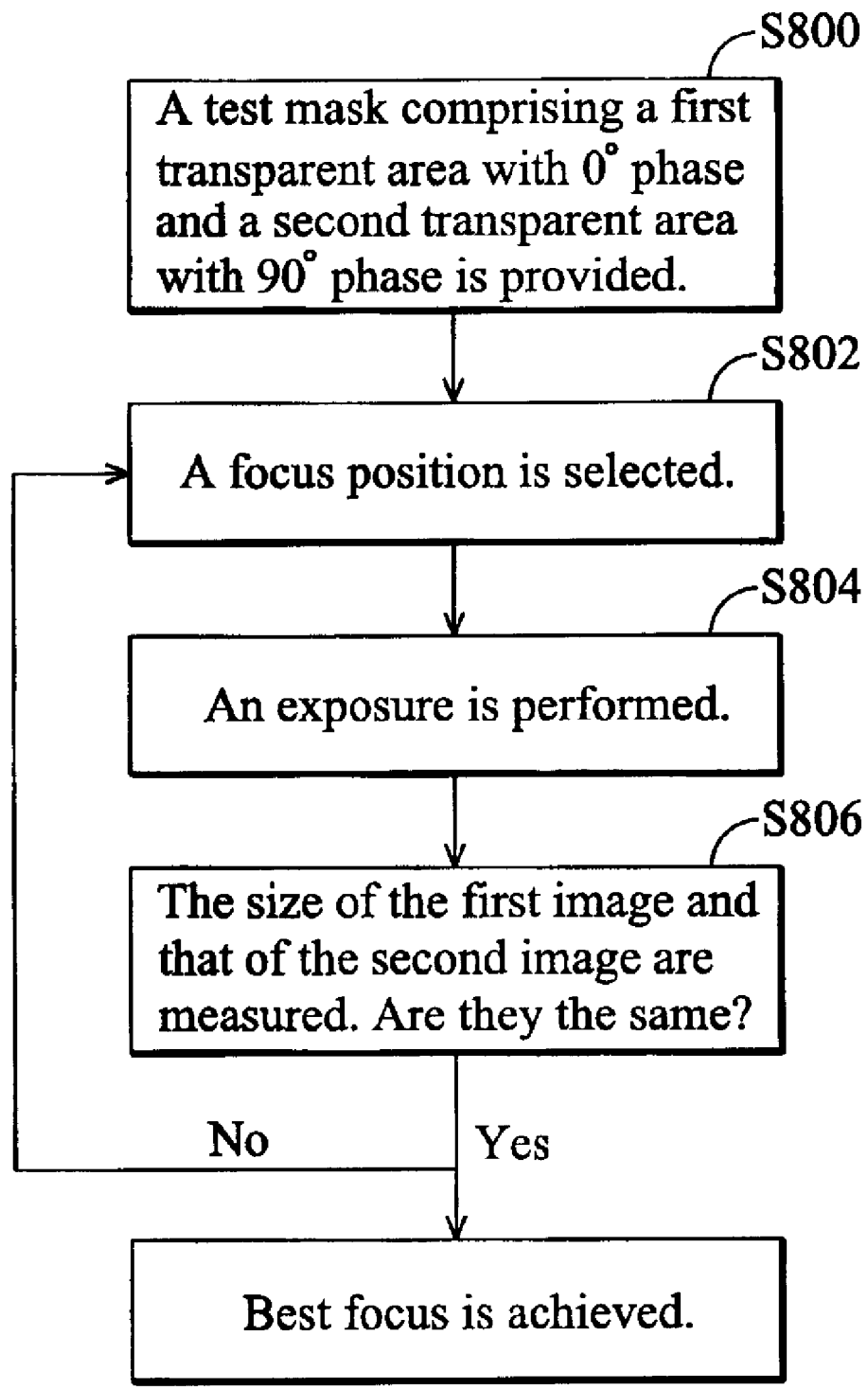
FIG. 1 is a flowchart illustrating steps according to the preferred embodiment of the invention.
Figure 2:
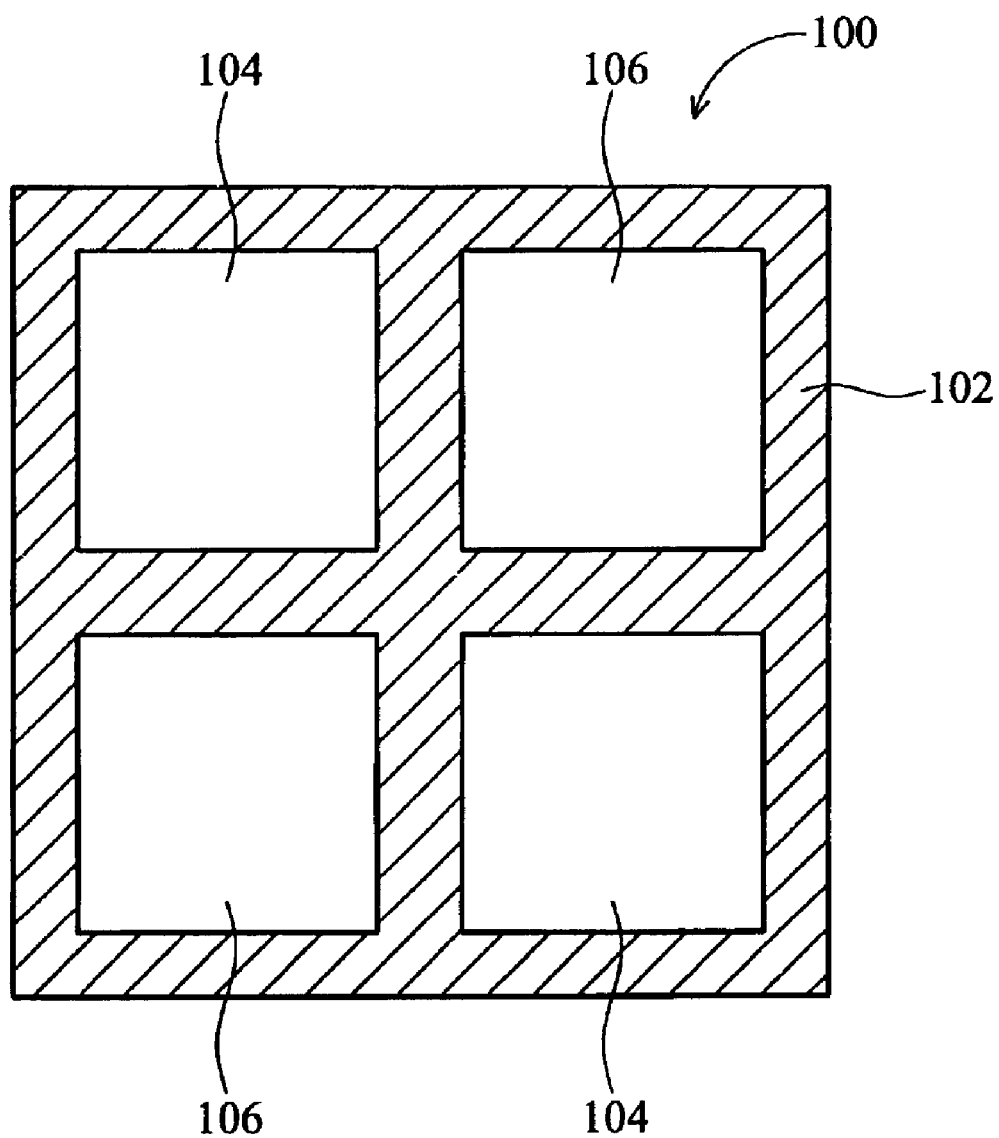
FIG. 2 is a schematic top view of the test mask according to the preferred embodiment of the invention.

As shown in FIG. 2, the test mask 100 comprises a transparent substrate and an opaque layer 102 covering parts of the transparent substrate to define a first transparent area 104 with 0° phase and a second transparent area 106 with 90° phase. The transparent substrate comprises quartz, and the opaque layer 102 comprises chromium.

According to the present invention, the size of the first transparent area 104 with 0° phase and the second transparent area 106 with 90° phase are the same, about 150~250 nm, and the distance between the first transparent area 104 with 0° phase and the second transparent area 106 with 90° phase is not more than the size of the first transparent area 104, about 100~200 nm. As well, the transparency of the first transparent area 104 and the second transparent area 106 are both about 100%, and that of the opaque layer 102 is about 0%. The total area of the test mask 100 is small enough that the test mask 100 can be either incorporated into process mask or separation.

Next, in step S802, a light source at a set distance from the test mask 100 is provided.

In step S804, an exposure is preformed to transmit the light source through the test mask 100 to produce an exposed image 200 comprising a first image 204 corresponding to the first transparent area 104 with 0° phase and a second image 206 corresponding to the second transparent area 106 with 90° phase.

Figure 3:
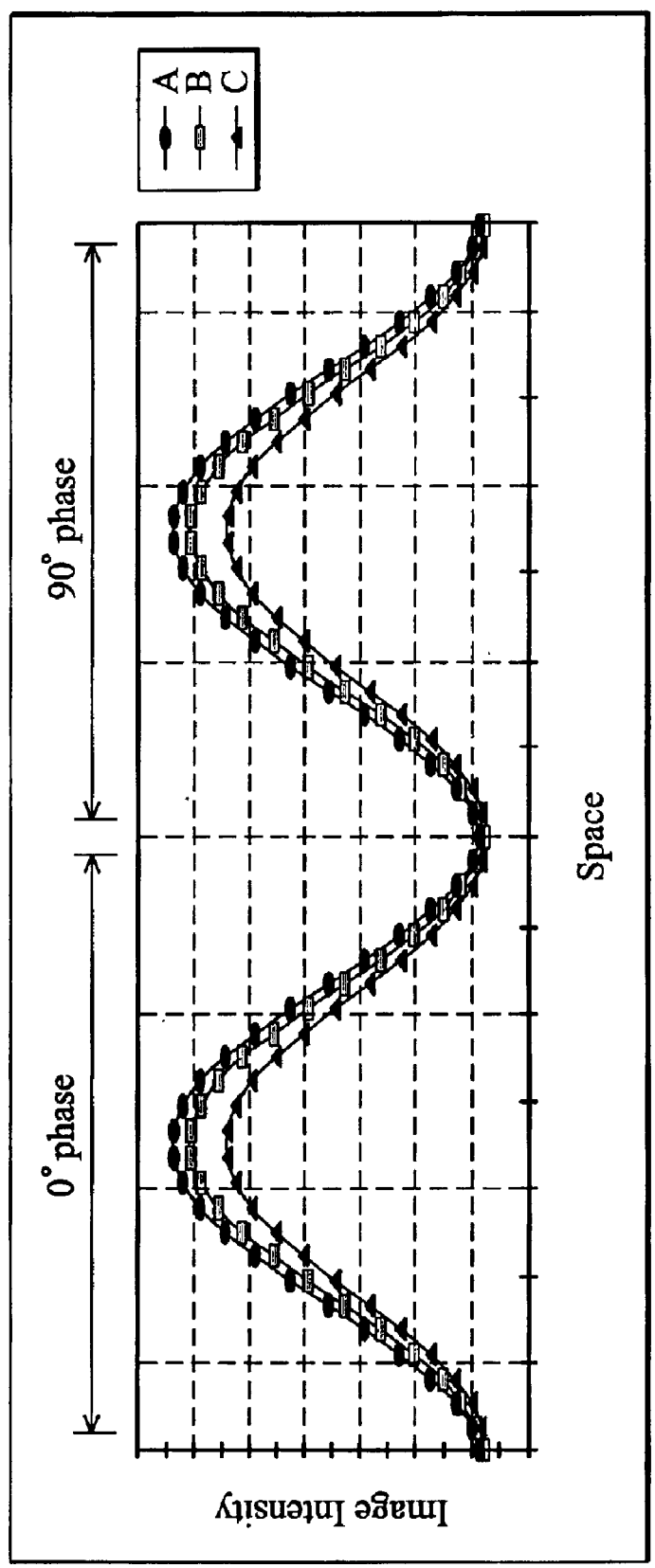
FIG. 3 is a schematic drawing illustrating the relationship between the space and the image intensity after exposure using the test mask as shown in FIG. 2.

According to an aspect of the present invention, the first image 204 exposed by the first transparent 104 with 0° phase and the second image 206 exposed by the second transparent 106 with 90° phase absorb equivalent energy when the light source is located at the best focus position, such that the sizes of the first and second images are the same. However, the first image 204 and the second image 206 absorb different amounts of energy when the light source is not located at the best focus position. In FIG. 3, curve A and curve C are both the result of exposure under less-than-ideal focus, thus, the intensity of the first image 204 and that of the second image 206 are different. Curve B is the result of the exposure under best focus, thus, the intensity of the first image 204 and that of the second image 206 are the same.

Thus, in step S806, the size of the first image 204 and that of the second image 206 are then measured.

Figure 4:
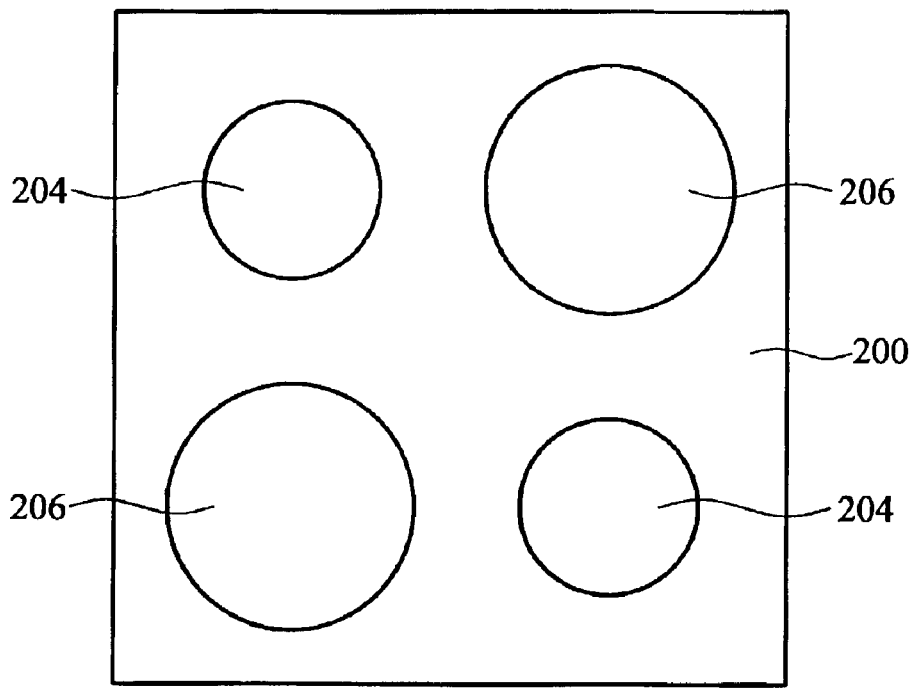
FIG. 4 is a schematic drawing showing the exposure result under non-best focus.
Figure 4:
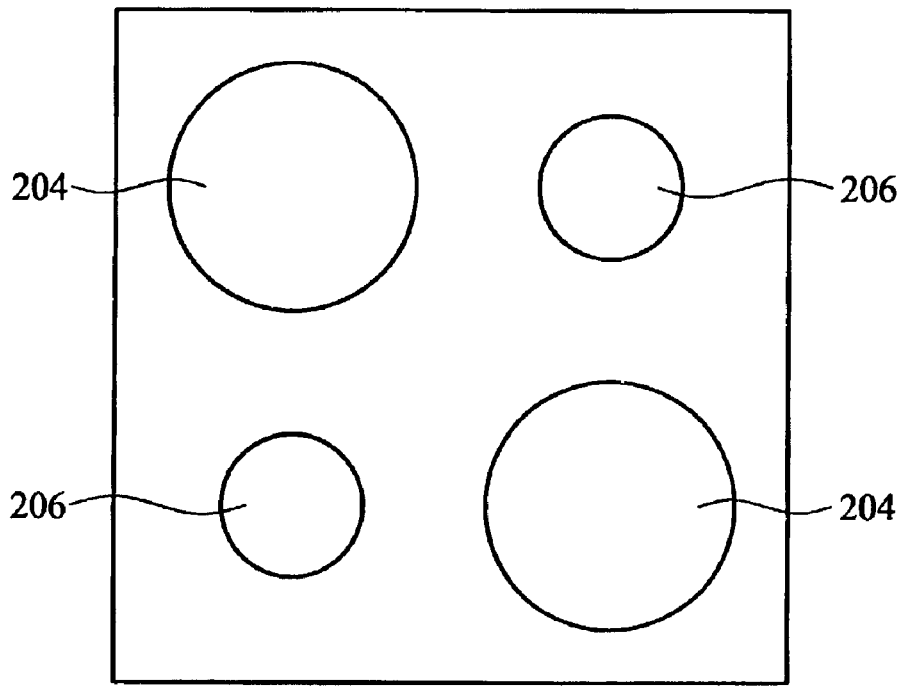
Figure 5:
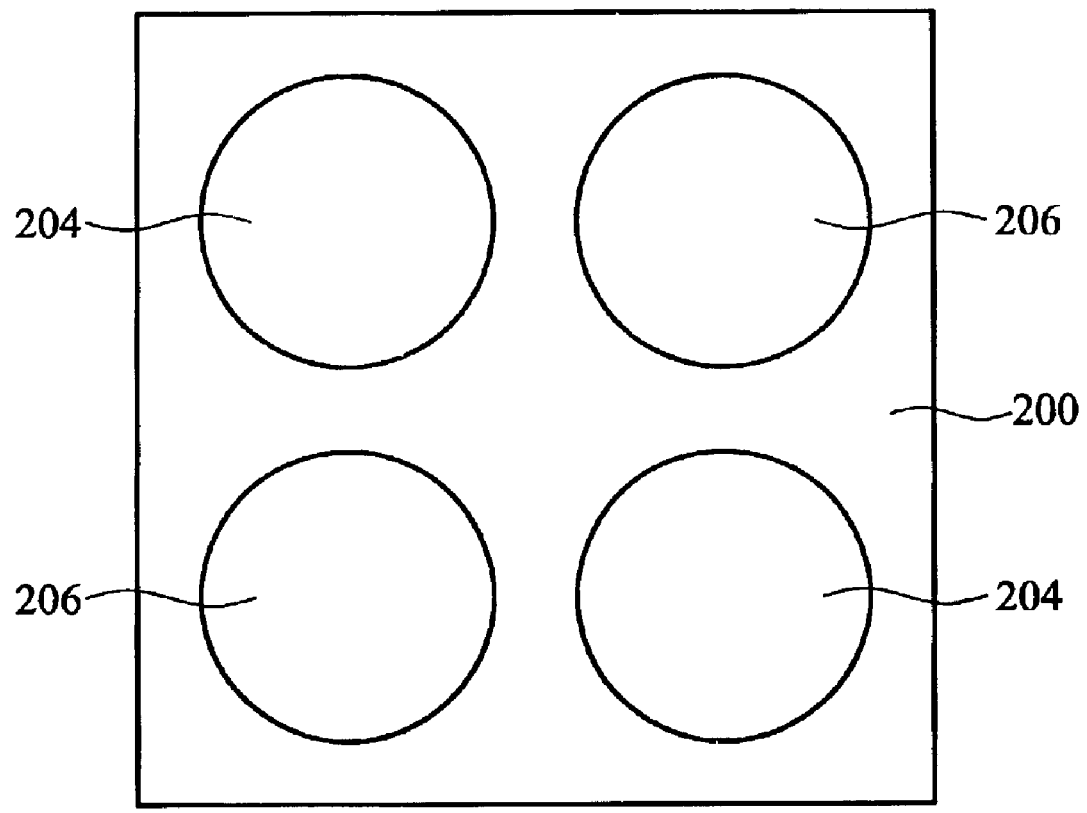
FIG. 5 is a schematic drawing showing the exposure result under best focus.

Finally, after adjusting the distance between the light source and the test mask 100, step S802, step S804, and step S806 are repeated if the sizes of the first image 204 and the second image 206 are different, as shown in FIG. 4. After repeating step S802, step S804, and step S806 several times, the best focus position can be achieved when the sizes of the first image 204 and the second image 206 are the same, as shown in FIG. 5.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A best focus determining method, comprising:

providing a test mask comprising a transparent substrate and an opaque layer covering parts of the transparent substrate to define a first transparent area with 0° phase and a second transparent area with 90° phase, wherein the sizes of the two transparent areas with 0° and 90° phases respectively, are the same;

transmitting a light source through the test mask to expose a first image corresponding to the first transparent area with 0° phase and a second image corresponding to the second transparent area with 90° phase, wherein the light source maintains a distance from the test mask;

measuring the sizes of the first and second images;

repeating the transmission and measurement steps after adjusting the distance between the light source and the test mask until the sizes of the first and second images are the same if the originating sizes of the first and second images thereof were different.

2. The method as claimed in claim 1, wherein the test mask is a phase shifting mask (PSM).

3. The method as claimed in claim 1, wherein the distance between the first transparent area with 0° phase and the second transparent area with 90° phase is not larger than the size of the first transparent area.

4. The method as claimed in claim 1, wherein the transparent substrate comprises quartz.

5. The method as claimed in claim 1, wherein the opaque layer comprises chromium.

6. The method as claimed in claim 1, wherein the transparency of the first transparent area with 0° phase is about 100%.

7. The method as claimed in claim 1, wherein the transparency of the second transparent area with 90° phase is about 100%.

8. The method as claimed in claim 1, wherein the transparency of the opaque layer is about 0%.

* * * * *